United States Patent [19]
Lee et al.

[11] Patent Number: 5,682,350
[45] Date of Patent: Oct. 28, 1997

[54] FLASH MEMORY WITH DIVIDED BITLINE

[75] Inventors: Peter W. Lee, Saratoga, Calif.; Hsing-Ya Tsao; Fu-Chang Hsu, both of Taipei, Taiwan

[73] Assignee: Aplus Integrated Circuits, Inc., Saratoga, Calif.

[21] Appl. No.: 726,670

[22] Filed: Oct. 7, 1996

Related U.S. Application Data

[63] Continuation-in-part of Ser. No. 624,322, Mar. 29, 1996, Ser. No. 645,630, May 14, 1996, Ser. No. 664,639, Jun. 17, 1996, Ser. No. 676,066, Jul. 5, 1996, and Ser. No. 691,281, Aug. 1, 1996.

[51] Int. Cl.$^6$ ............................... G11C 16/00
[52] U.S. Cl. .................. 365/185.13; 365/185.11; 365/185.17; 365/185.05; 365/185.33; 365/230.03
[58] Field of Search ............. 365/185.13, 185.05, 365/185.06, 185.33, 185.11, 230.03, 185.17

[56] References Cited

U.S. PATENT DOCUMENTS

| | | | |
|---|---|---|---|
| 5,345,416 | 9/1994 | Nakagawara | 365/185.13 |
| 5,365,484 | 11/1994 | Cleveland et al. | 365/185.13 |
| 5,554,867 | 9/1996 | Ajika et al. | 365/185.05 |

*Primary Examiner*—Tan T. Nguyen
*Attorney, Agent, or Firm*—Flehr Hohbach Test Albritton & Herbert LLP

[57] ABSTRACT

A flash memory includes a bank of flash transistors forming a plurality of rows and a plurality of columns, each flash transistor having a gate, drain and source, where the gates of flash transistors in each row are coupled to common wordlines, the drains of flash transistors in each column are coupled to common metal 1 lines divided into even metal 1 lines and odd metal 1 lines and the sources of the flash transistors are coupled to a common sourceline. A set of first selection transistors are coupled between even metal 1 lines and metal 2 lines having a pitch twice that of said metal 1 lines and controlled by a first select signal to selectively couple the even metal 1 lines to the metal 2 lines. A set of second selection transistors are coupled between odd metal 1 lines and the metal 2 lines and controlled by a second select signal to selectively couple the odd metal 1 lines to the metal 2 lines. In one embodiment, the set of first selection transistors and the set of second selection transistors are large in comparison to the flash transistors. Advantages of the invention include improved selection of memory cells, higher memory cell density and lower resistance in the memory cell selection circuitry.

10 Claims, 1 Drawing Sheet

FLASH MEMORY WITH DIVIDED BITLINE

This is a continuation in part of all the following applications and incorporates all the applications by reference: U.S. patent application Ser. No. 08/624,322 filed on Mar. 29, 1996; U.S. patent application Ser. No. 08/645,630 filed on May 14, 1996; U.S. patent application Ser. No. 08/664,639 filed on Jun. 17, 1996; U.S. patent application Ser. No. 08/676,066 filed on Jul. 5, 1996; and U.S. patent application Ser. No. 08/691,281 filed on Aug. 1, 1996.

FIELD

The present invention relates generally to flash memories and particularly to a flash memory with a divided bitline.

BACKGROUND

Flash memories are receiving increased attention in the marketplace. One reason is that data stored in a flash memory is nonvolatile and can be erased and programmed electrically. Advantages of flash memories over earlier nonvolatile memories such as EPROM and EEPROM include the ability of electrical erasure and small size for high density memory applications. However, many of the existing designs do not adequately provide for metal layer access to the memory transistors in high density memory applications. For example, U.S. Pat. No. 5,126,808 assigned to Advanced Micro Devices and incorporated herein by reference, describes a conventional technique of providing a metal 1 bitline for every column of memory transistors and providing a metal 2 bitline for every metal 1 bitline. Each divided bitline is connected to a global metal 2 bitline via an N-channel pass-gate transistor. These pass-gate transistors are constructed very small to fit within a very small bitline pitch. As a result of the restrictive geometry, the pass-gate transistors have relatively high resistance. The high resistance pass-gates in series with the selected flash transistors degrades the memory access speed during read operations and the program performance during program and erase operations. When the pass-gate resistance is combined with the flash memory cell resistance during an erase operation, for example, there exists a possibility that a selected cell will not be properly erased and other deselected cells may be overerased. This causes excessive current leakage through the overerased deselected cells. As a result, the erased cells can not be accurately repaired or programmed to a desired threshold voltage due to the mis-verification of the erase repair operation. Further, as memory cell size decreases in the future with improved integrate circuit fabrication techniques, the conventional construction of a metal 2 line for every metal 1 line falls to provide for the space needed to access all the memory cells.

What is needed is a memory construction that allows for small memory cell size that can permit less than one metal 2 line for each metal 1 line, and that has a low resistance selection circuit.

SUMMARY

A flash memory according to an embodiment of the invention includes a bank of flash transistors forming a plurality of rows and a plurality of columns, each flash transistor having a gate, drain and source, where the gates of flash transistors in each row are coupled to common wordlines, the drains of flash transistors in each column are coupled to common metal 1 lines divided into even metal 1 lines and odd metal 1 lines and the sources of the flash transistors are coupled to a common sourceline. A set of first selection transistors are coupled between even metal 1 lines and metal 2 lines having a pitch twice that of said metal 1 lines and controlled by a first select signal to selectively couple the even metal 1 lines to the metal 2 lines. A set of second selection transistors are coupled between odd metal 1 lines and the metal 2 lines and controlled by a second select signal to selectively couple the odd metal 1 lines to the metal 2 lines. In one embodiment, the set of first selection transistors and the set of second selection transistors are large in comparison to the flash transistors.

Advantages of the invention include improved selection of memory cells, higher memory cell density and lower resistance in the memory cell selection circuitry.

DESCRIPTION OF THE FIGURES

Additional objects and features of the invention will be more readily apparent from the following detailed description and the pending claims when taken in conjunction with the drawings, in which:

DETAILED DESCRIPTION

Figure 1:
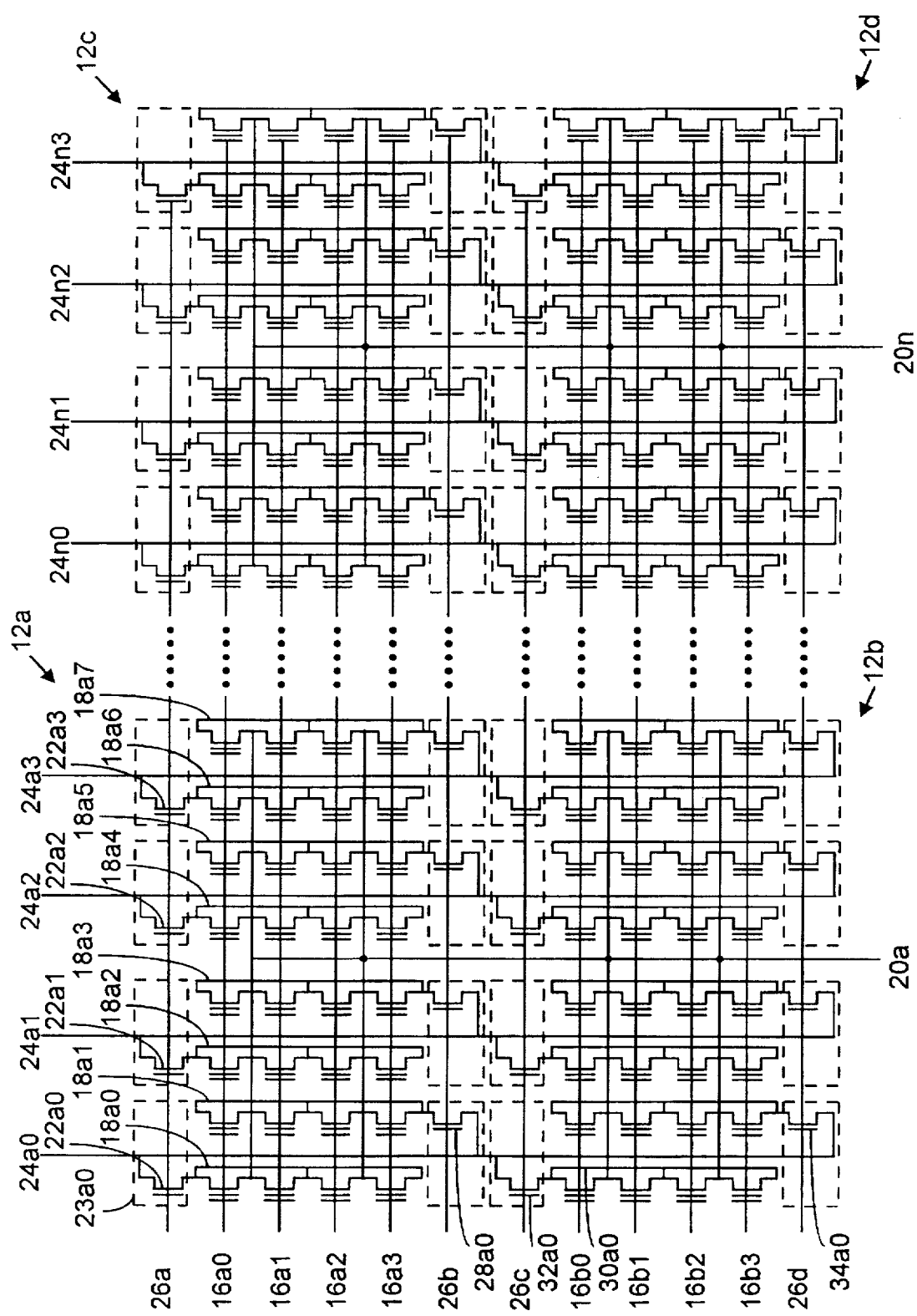
FIG. 1 depicts a flash memory array according to an embodiment of the invention.

The invention relates to flash memories. FIG. 1 depicts a flash memory 10 according to an embodiment of the invention. As shown, the memory 10 includes a plurality of banks 12a–d. The memory cells are constructed of conventional flash transistors, such as those described in U.S. Pat. No. 5,126,808.

Referring to FIG. 1, the flash transistors are organized into banks 12a–12d where the transistors form a plurality of rows and a plurality of columns. With reference to bank 12a, each flash transistor has a gate, drain and source. The gates of the flash transistors in each row are coupled to common wordlines 16a0–16a3. The wordlines are coupled to a wordline decoder such as one described in U.S. patent application Ser. No. 08/691,281 filed on Aug. 1, 1996. The drains of the flash transistors in each column are coupled to common metal 1 lines 18a0–18a7, which are divided into even metal 1 lines and odd metal 1 lines. The metal 1 lines are conductors that connect the drains of the flash transistors into sub-bitlines. The even metal 1 lines 18a0, 18a2, 18a4 and 18a6 form an even group of metal 1 lines. The odd metal 1 lines 18a1, 18a3, 18a5 and 18a7 form an odd group of metal 1 lines. In the bank 12a, the sources of the flash transistors are coupled to a common sourceline 20a. The sourceline 20a is coupled to a sourceline decoder such as one described in U.S. patent application Ser. No. 08/691,281 filed on Aug. 1, 1996.

A set of first selection transistors 22a0–22a3 are coupled between even metal 1 lines 18a0, 18a2, 18a4 and 18a6, and metal 2 lines 24a0–24a3. Note that the metal 2 lines 22a0–22a3 have a pitch twice that of the metal 1 lines. The set of first selection transistors are controlled by a first select signal 26d to selectively couple the even metal 1 lines to the metal 2 lines. A set of second selection transistors 28a0–28a3 are coupled between odd metal 1 lines and the metal 2 lines 24a0–24a3. The set of second selection transistors are controlled by a second select signal 26b to selectively couple the odd metal 1 lines to the metal 2 lines. The metal 2 lines 24a0–24a3 are also referred to a bitlines 24a0–24a3 and are coupled to a bitline decoder such as one described in U.S. patent application Ser. No. 08/691,281 filed on Aug. 1, 1996.

In an aspect of the invention, the set of first selection transistors 22a0–22a3 and the set of second selection transistors 28a0–28a3 are large in comparison to the flash transistors. The dashed border identified by reference 23a0 represents the space that selection transistor 22a0 occupies in the flash memory. As shown, the size of selection transistor 22a0 is large compared to the flash transistors, and can take up approximately two times as much space as the metal 1 pitch since the metal 2 pitch is twice that of the metal 1 pitch. The larger size, predominantly in the gate of the selection transistors, reduces resistance in the memory cell selection circuitry.

Banks 12b–d are similarly constructed. For example, referring to bank 12b, the drains of the flash transistors in each column are coupled to common metal 1 lines 30a0–30a7, which are divided into even metal 1 lines and odd metal 1 lines. The metal 1 lines are conductors that connect the drains of the flash transistors into sub-bitlines. The even metal 1 lines 30a0, 30a2, 30a4 and 30a6 form an even group of metal 1 lines. The odd metal 1 lines 30a1, 30a3, 30a5 and 30a7 form an odd group of metal 1 lines. In the bank 12b, the sources of the flash transistors are coupled to a common sourceline 20a, which is also common to bank 12a.

A set of third selection transistors 32a0–32a3 are coupled between even metal 1 lines 30a0, 30a2, 30a4 and 30a6, and metal 2 lines 24a0–24a3. The set of third selection transistors are controlled by a third select signal 26c to selectively couple the even metal 1 lines to the metal 2 lines. A set of fourth selection transistors 34a0–34a3 are coupled between odd metal 1 lines and the metal 2 lines 24a0–24a3. The set of fourth selection transistors are controlled by a fourth select signal 26d to selectively couple the odd metal 1 lines to the metal 2 lines.

Banks 12c and 12d are constructed similar to banks 12a and 12b respectively. Bank 12c shares common wordlines 16a0–16a3 and select signals 26a and 26b with bank 12a. Bank 12d shares common wordlines 16b0–16b3 and select signals 26c and 26d with bank 12b. Bank 12c and 12d share common metal 2 lines 24n0–24n3 with one another. With the description of the embodiment showing four banks 12a–12d, one skilled in the art will recognize that any number of banks can be constructed according to the invention. A principle feature of the invention is the division of even metal 1 lines and odd metal 1 lines selectively coupled to metal 2 lines. Every bank 12a–12d contains this characteristic, which can be incorporated into larger memories containing many more banks than shown in FIG. 1.

In the multiple bank embodiments, selection transistors in adjacent banks can accommodate space for one another. For example, referring to banks 12a and 12b, selection transistors 28a0–28a3 from bank 12a and selection transistors 32a0–32a3 from bank 12b can accommodate space for one another by using space adjacent to one another and on opposite sides of the metal 2 lines 24a0–24a3.

Conclussion

Advantages of the invention include improved selection of memory cells, higher memory cell density and lower resistance in the memory cell selection circuitry.

Having disclosed exemplary embodiments and the best mode, modifications and variations may be made to the exemplary embodiments while remaining within the scope of the invention as defined by the following claims.

What is claimed is:

1. A flash memory comprising:

a first bank of flash transistors forming a plurality of rows and a plurality of columns, each flash transistor having a gate, drain and source, where the gates of flash transistors in each row are coupled to common wordlines, the drains of flash transistors in each column are coupled to common conductor 1 lines and the sources of the flash transistors are coupled to a first sourceline;

a first selection transistor coupled between a first conductor 1 line and a first of a plurality of conductor 2 lines having a pitch twice that of said conductor 1 lines and controlled by a first select signal to selectively couple said first conductor 1 line and said first conductor 2 line; and a second selection transistor coupled between a second conductor 1 line and said first conductor 2 line and controlled by a second select signal to selectively couple said second conductor 1 line and said first conductor 2 line.

2. The flash memory of claim 1, wherein:

said first selection transistor and said second selection transistor are large in comparison to said flash transistors.

3. The flash memory of claim 1, further comprising:

a third selection transistor coupled between a third conductor 1 line and a second conductor 2 line and controlled by said first select signal to selectively couple said third conductor 1 line and said second conductor 2 line; and a fourth selection transistor coupled between a fourth conductor 1 line and said second conductor 2 line and controlled by said second select signal to selectively couple said fourth conductor 1 line and said second conductor 2 line.

4. The flash memory of claim 3, wherein:

said first selection transistor, said second selection transistor, said third selection transistor and said fourth selection transistor are large in comparison to said flash transistors.

5. The flash memory of claim 1, further comprising:

a second bank of flash transistors forming a plurality of rows and a plurality of columns, each flash transistor having a gate, drain and source, where the gates of flash transistors in each row are coupled to common wordlines, the drains of flash transistors in each column are coupled to common conductor 1 lines and the sources of the flash transistors are coupled to said first sourceline;

a third selection transistor coupled between a third conductor 1 line and said first conductor 2 line and controlled by a third select signal to selectively couple said third conductor 1 line and said first conductor 2 line; and a fourth selection transistor coupled between a fourth conductor 1 line and said first conductor 2 line and controlled by a fourth select signal to selectively couple said fourth conductor 1 line and said first conductor 2 line.

6. The flash memory of claim 5, wherein:

said first selection transistor, said second selection transistor, said third selection transistor and said fourth selection transistor are large in comparison to said flash transistors.

7. A flash memory comprising:

a bank of flash transistors forming a plurality of rows and a plurality of columns, each flash transistor having a gate, drain and source, where the gates of flash transistors in each row are coupled to common wordlines, the drains of flash transistors in each column are coupled to common conductor 1 lines divided into even conductor 1 lines and odd conductor 1 lines and the sources of the flash transistors are coupled to a common sourceline;

a set of first selection transistors coupled between even conductor 1 lines and conductor 2 lines having a pitch twice that of said conductor 1 lines and controlled by a first select signal to selectively couple said even conductor 1 lines to said conductor 2 lines; and a set of second selection transistors coupled between odd conductor 1 lines and said conductor 2 lines and controlled by a second select signal to selectively couple said odd conductor 1 lines to said conductor 2 lines.

8. The flash memory of claim 7, wherein:

said set of first selection transistors and said set of second selection transistors are large in comparison to said flash transistors.

9. A method of manufacturing a flash memory, comprising the steps of:

forming a bank of flash transistors in a plurality of rows and a plurality of columns, each flash transistor having a gate, drain and source, where the gates of flash transistors in each row are coupled to common wordlines, the drains of flash transistors in each column are coupled to common conductor 1 lines divided into even conductor 1 lines and odd conductor 1 lines and the sources of the flash transistors are coupled to a common sourceline;

forming a set of first selection transistors;

coupling said set of first selection transistors between even conductor 1 lines and conductor 2 lines having a pitch twice that of said conductor 1 lines and controlled by a first select signal to selectively couple said even conductor 1 lines to said conductor 2 lines;

forming a set of second selection transistors; and coupling said set of second selection transistors between odd conductor 1 lines and said conductor 2 lines and controlled by a second select signal to selectively couple said odd conductor 1 lines to said conductor 2 lines.

10. The method of claim 9, wherein:

said step of forming a set of first selection transistors is performed by forming a set of first selection transistors that are large in comparison to said flash transistors; and said step of forming a set of second selection transistors is performed by forming a set of second selection transistors that are large in comparison to said flash transistors.

* * * * *